United States Patent [19]

Matsuzaki et al.

[11] Patent Number: 5,463,226

[45] Date of Patent: Oct. 31, 1995

[54] ELECTROMAGNETIC WAVE DETECTING APPARATUS

[75] Inventors: Kazuo Matsuzaki; Akira Amano, both of Kawasaki, Japan

[73] Assignee: Fuji Electric Co., Ltd., Japan

[21] Appl. No.: 271,458

[22] Filed: Jul. 7, 1994

[30] Foreign Application Priority Data

Jul. 22, 1993 [JP] Japan ................................ 5-180530

[51] Int. Cl.$^6$ ............................................. G01J 5/10
[52] U.S. Cl. ................ 250/374; 250/336.1; 250/338.1; 250/339.01; 250/385.1
[58] Field of Search ................................ 250/336.1, 338.1, 250/374, 339.02, 339.01, 349, 385.1

[56] References Cited

U.S. PATENT DOCUMENTS 4,952,811  8/1990  Elliott .................................. 250/338.1

FOREIGN PATENT DOCUMENTS 1238569  4/1967  Germany ........................... 250/336.1
3-261040 11/1991  Japan .

OTHER PUBLICATIONS

J. Appl. Phys., vol. 47, No. 12, "Physical Properties of thin-film field emission cathodes with molybdenum cones", Spindt et al., pp. 5248–5263 (1976).

J. Japanese Appl. Phys. vol. 59, No. 41, pp. 164–169 (1990).

*Primary Examiner*—Carolyn E. Fields
*Attorney, Agent, or Firm*—Parkhurst, Wendel & Rossi

[57] ABSTRACT

A miniaturized electromagnetic wave detecting apparatus is provided that detects wavelengths from the microwave to the infrared regions in any environment. Electrons are field-emitted from an electron emitting means comprising a cold cathode and a gate electrode 2. Spiral motion and elongation of traveling length of the emitted electrons are enhanced by orthogonal magnetic field applied by a magnetic field application means while the electrons are attracted to the anode. The electrons are accelerated by the cyclotron resonance enhanced when the angular cyclotron resonance frequency $\omega_c$, determined by the magnetic flux density of the orthogonal magnetic field, and the angular frequency $\omega_f$ of the electromagnetic wave to be measured coincide with each other. The accelerated electrons collide with and dissociate the dilute gas molecules to produce multiplied ion-pairs, which are then captured by the cathode and anode. The wavelength of the electromagnetic wave is measured from the angular frequency $\omega_c$ of the cyclotron resonance by detecting the anode current peak observed when the cyclotron resonance is enhanced.

5 Claims, 6 Drawing Sheets

ELECTROMAGNETIC WAVE DETECTING APPARATUS

FIELD OF THE INVENTION

The present invention relates to an electromagnetic wave detecting apparatus that utilizes cold cathode electron emission and cyclotron resonance phenomena.

BACKGROUND

A microwave detecting apparatus according to the prior art detects microwave intensity by measuring electric potential obtained by rectifying a current induced by a received microwave with a point-contact silicon diode.

Another electromagnetic wave detecting apparatus according to the prior art employs a thermal detector like a thermistor or a bolometer. Though these detecting apparatuses detect electromagnetic wave intensity in a specific wavelength range, they can not detect the wavelength of the electromagnetic wave. The prior art microwave detecting apparatuses are not suitable to be used in a high temperature environment or under radiation exposure because their temperature rise due to the environment temperature or irradiation absorption prevents them from producing a measurement with high accuracy.

According to still the other prior arts, optical wave length is detected by a spectrophotometer that comprises an optical prism spectrometer and a photomultiplier. A long radio wavelength is detected by a receiver that detects a turned oscillating current corresponding to the received radiowave. A short wavelength like that of an X-ray is detected with a combination a diffraction grating and a counter.

Though each of these wavelength detecting apparatuses has a specific structure which is well suited for detecting a wavelength in a predetermined wavelength range with high accuracy (with high wavelength resolution), the apparatuses are not suitable for down-sizing because of their large scale composite structures. The wavelength ranges that the prior art wavelength detecting apparatuses can detect (dynamic ranges) are narrow and any wavelength detecting apparatus has not been realized so far that detects wavelengths from the microwave to the infrared regions.

In view of the foregoing, an object of the present invention is to provide a miniaturized electromagnetic wave detecting apparatus that detects wavelengths from the microwave to infrared regions in any environment.

SUMMARY OF THE INVENTION

The object of the present invention is achieved by an electromagnetic wave detecting apparatus that comprises an electron emitting means further comprising a cold cathode for emitting electrons by electric potential applied to the cold cathode; an electron capturing means further comprising an anode for capturing attracted electrons from the cathode through vacuum space; a magnetic field application means further comprising an electromagnet that can vary an excitation current of the electromagnet for applying in the vacuum space a magnetic field orthogonal to an electric field applied between the cathode and the anode; and a sealing means for sealing in dilute gas in the vacuum space.

The object of the present invention is also achieved by an electromagnetic wave detecting apparatus that comprises a plurality of electromagnetic wave detecting cells, each of which further comprises an electron emitting means further comprising a cold cathode for emitting electrons by electric potential applied the cathode; an electron capturing means further comprising an anode for capturing electrons attracted from the cathode through vacuum space; a magnetic field application means for applying in the vacuum space a magnetic field orthogonal to an electric field applied between the cathode and the anode; and a sealing means for sealing in dilute gas in the vacuum space, in which the magnetic field application means of the electromagnetic wave detecting cells comprise fixed magnetic field application means for applying fixed orthogonal magnetic fields, magnetic flux densities thereof are different from each other.

The aforementioned electromagnetic wave detecting apparatus and the detecting cell according to the present invention employ a configuration that facilitates manufacturing the apparatus and the cell by the semiconductor processing technique. Specifically, an electromagnetic wave detecting apparatus preferable for manufacturing by the semiconductor processing technique comprises an insulation layer, formed on a semiconductor substrate, further comprising a recess portion; a cathode formed on one side of the recess portion on the insulation layer; an anode formed on another side opposed to the one side of the recess portion on the insulation layer; a control electrode formed on the side of the cathode on the recess portion; a sealing means for sealing in dilute gas in vacuum space enveloping the cathode, the anode, and the control electrode; and a magnetic field application means for applying a magnetic field orthogonal to an electric field applied between the cathode and the anode.

The magnetic field application means preferably comprises an electromagnet disposed on a back surface of the semiconductor substrate.

Alternatively, the magnetic field application means preferably comprises a thin film electromagnet buried in the insulation layer on the semiconductor substrate.

BRIEF DESCRIPTION OF THE DRAWINGS

The invention will be described in detail hereinafter with reference to the accompanied drawings, wherein:

FIG. 1 is a diagram for explaining the principle of the present invention, in which

FIG. 2 is a diagram showing the configuration of the first embodiment of the electromagnetic wave detecting apparatus according to the present invention, in which FIG. 2(a) is a perspective view and FIG. 2(b) is a sectional view;

DETAILED DESCRIPTION OF PREFERRED EMBODIMENTS

Prior to discussing the specific structural elements of an apparatus in accordance with the invention, the principle of electromagnetic wave detection according to the present invention will be discussed.

A travelling length of an electron as a charged particle emitted by the electron emission phenomenon is increased by cyclotron motion enhanced by the orthogonal magnetic field on the way of its attraction to the anode. The electron in circular motion is accelerated by repeatedly feeding kinetic energy by the cyclotron resonance enhanced when an angular cyclotron frequency ωc of the electron, that is determined by magnetic flux density orthogonal to the circular trajectory of the electron, and an angular frequency $\omega_f$ of an irradiated electromagnetic wave to be measured coincide with each other. The accelerated electron collides with dilute gas molecules to ionize the gas molecules. The electrons multiplied by the ionization are captured by the anode and the ionized particles are captured by the cathode. A much larger peak current is obtained from the anode when the cyclotron resonance is enhanced than an anode current based only on the electrons when the cyclotron resonance is not enhanced. Since the peak current is obtained by changing a magnetic flux density, the wavelength of the irradiated electromagnetic wave is detected from the angular frequency $\omega_f$ of an irradiated electromagnetic wave that coincides with the angular cyclotron frequency $\omega_c$.

Figure 1A:
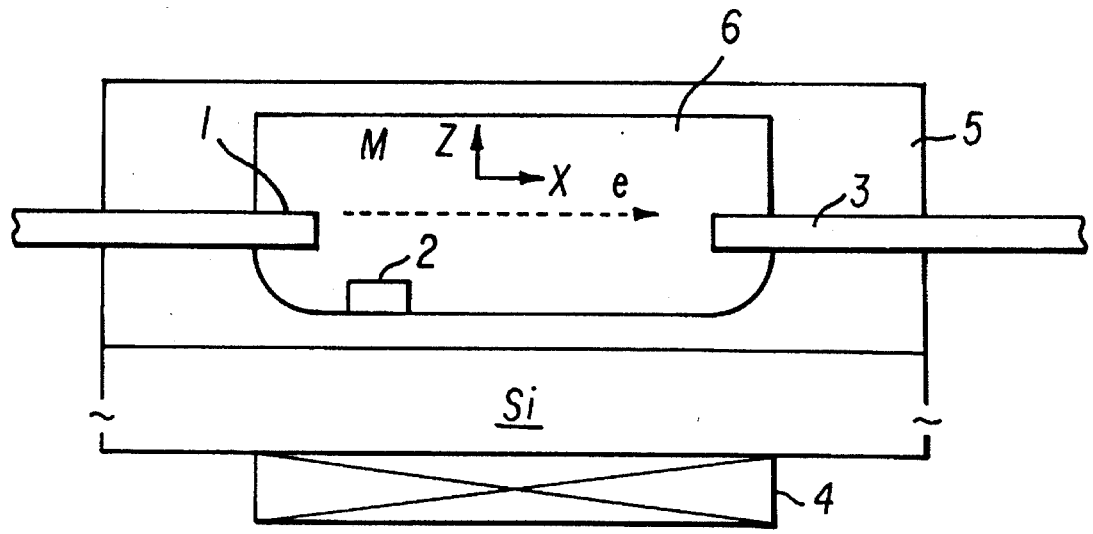
FIG. 1(a) shows a schematic sectional view of an electromagnetic wave detecting apparatus and FIG. 1(b) shows motion of an emitted electron.

The above principle is explained more in detail with reference to FIG. 1. The electromagnetic wave detecting apparatus comprises, an electron emitting means, further comprising a cathode 1 and a gate electrode (control electrode) 2, and an anode 3. A cold cathode is employed as the cathode 1. According to the present invention, a hot cathode is not used as the cathode 1. Electrons are drawn out from the cathode 1 by the Schottky effect (tunnel effect), because an electric field of the gate electrode 2 modulates a work function of cathode material to reduce integrated potential on the boundary surface of the cathode 1. A current density j of the electrons emitted by field emission from the cathode 1 is given by following Fowler-Nordheim equation:

$$j = BEo^2 \exp(-C/E_o), \quad (1)$$

where, $E_o$ represents an external electric field by the cathode 1 and the gate electrode 2, and B and C are constants. Though equation (1) is derived under the assumption that electrons which belong to the lower levels than the Fermi level are emitted at 0° K., it is experimentally well known that the equation shows such temperature independence that the equation may be used at higher temperatures than the room temperature.

Figure 1B:
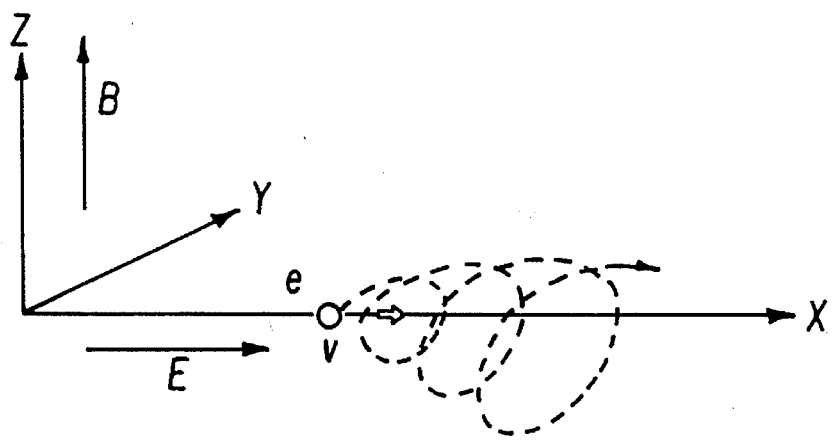

The field-emitted electron moves towards the anode 3 attracted by an electric field E of the anode 3. The moving electron executes circular motion at an angular frequency $e_\omega$ represented by a following equation on an XY plane in the orthogonal coordinates defined by an X axis set along the electric field E and a Z axis set along a uniform orthogonal magnetic field:

$$\omega_c = eB/m = 175.65B \; GHz, \quad (2)$$

where, e represents electric charge of an electron, m mass of an electron, and B a flux density of the orthogonal magnetic field. The cyclotron angular frequency $\omega_c$ does not depends on velocity of an electron and is proportional to the magnetic flux density B. Therefore the angular frequency $\omega_c$ increases and circular trajectory (traveling length) of the electron elongates with increasing magnetic flux density B. Thus the electron executes circular motion while moving towards the anode 3 as shown in FIG. 1(b).

In this situation, cyclotron resonance is enhanced under specific conditions when an electromagnetic wave is irradiated to an electron path. Since the electron is accelerated when the angular frequency of vibration $\omega_f$ of the electromagnetic wave coincides with the angular cyclotron frequency $\omega_c$ and an electric field direction of the irradiated electromagnetic wave coincides with the X-axis, velocity of the electron in circular motion becomes faster and radius of circular motion R given by a following equation gradually increases.

$$R = mv/(eB) = v/\omega_c \quad (3)$$

Thus, the electron travels towards the anode 3 along a spiral trajectory.

Since the angular cyclotron resonance frequency $\omega_c$ can be changed in proportion to the magnetic flux density B, cyclotron resonance can be enhanced by changing the magnetic flux density B. In the first embodiment of the present invention, the cyclotron resonance is enhanced by changing the magnetic flux density B by means of a change of excitation current value of an electromagnet employed as the magnetic field application means 4.

If one can detect by some means cyclotron resonance as a coincidence point of the cyclotron resonance frequency $\omega_c$ with the angular vibration frequency $\omega_f$ of the electromagnetic wave, it will be possible to measure wave length of the electromagnetic wave by the equation 2. The present invention obtains an accelerated electron by cyclotron resonance, obtains multiplied charged particles (ion pairs) by ionizing dilute gas (sealed gas) molecules M by collision of the accelerated electron with the gas molecules to amplify an anode current to a peak, and detects the thus obtained anode peak current.

The dilute gas is sealed in by a sealing means 5 in a vacuum space 6. Since the electron accelerated by the cyclotron resonance acquires kinetic energy higher than dissociation energy of the molecule (atom) of the dilute gas and increased collision probability due to the elongated traveling length as a result of its spiral movement, the accelerated electron collides with and dissociates to ionize the gas molecule M to generate one or two ionized electron or electrons. Since the ionized electron or electrons are then accelerated to trigger further ionization of the gas molecules or atoms, multiplied electrons and ions exponentially increase in the vacuum space. The electrons are captured by the anode 3 and ions by the cathode 1. Though only field-emitted electrons are captured by the anode to generate small anode current when the cyclotron resonance is not enhanced, an anode current peak is observed as a result of large anode current based on the multiplied carriers when the cyclotron resonance is enhanced.

Wavelength of the electromagnetic wave is determined from an excitation current of the electromagnet at which the cyclotron resonance is enhanced, the enhancement of which is confirmed by an anode current peak observed by sweeping the excitation current so that it is increased with time. Since the angular cyclotron resonance frequency $\omega_c$ is proportional to the excitation current corresponding to the magnetic flux density B, wavelengths are measured over several orders of magnitude by changing excitation current value by more than several orders of magnitude. Therefore, a wavelength detector with wide dynamic range is realized that detects wavelengths from the microwave to the infrared regions.

Since electrons are obtained by cold cathode electron emission according to the present invention, the electromagnetic wave detecting apparatus works in any unfavorable environment, at high temperatures or under radiation exposure for example, without being affected by background noises. Since the electromagnetic wave detecting apparatus according to the present invention is suitable to be manufactured by the semiconductor processing techniques, the electromagnetic wave detecting apparatus facilitates extreme down-sizing and cost reduction.

By the adoption of the electromagnetic wave detecting apparatus according to the present invention, electromagnetic wave intensity can be determined by measuring peak height of the anode current because the peak height corresponds to the intensity of the irradiated electromagnetic wave.

Though lowering of degree of vacuum caused by too high partial pressure of the sealed gas suppresses cold cathode electron emission to hinder discharge, the dilute sealed gas of the present invention avoids this hindrance. Though the discharge is hindered when electric potential of the anode is too high, it is not necessary to raise the electric potential of the anode, according to the present invention, because electrons are accelerated through cyclotron resonance enhanced by the electric field of the irradiated electromagnetic wave. Though the sealed gas is very dilute, ionization triggered by dissociation proceeds without any trouble because the collision probability of the electron with the sealed gas is increased, according to the present invention, by the spiral movement of the electron.

Since the first embodiment of the present invention detects cyclotron resonance frequency by sweeping excitation current of the electromagnet so that it is increased with time, it is necessary to gradually vary intensity of the uniform orthogonal magnetic field, that causes extended sweeping period of time. Therefore the electromagnetic wave detecting apparatus of the first embodiment is not suitable to detect wavelengths that change from time to time, because the extended sweeping period deteriorates wavelength detection response and reduces margin in sampling timing selection.

The electromagnetic wave detecting apparatus of the second embodiment adopts a configuration that facilitates real time wavelength detection. The electromagnetic wave detecting apparatus of second embodiment comprises a plurality of electromagnetic wave length detector cells, each of which further comprises the same functional elements with the detecting apparatus of the first embodiment. The magnetic field application means of the detector cells comprise fixed magnetic field application means for applying fixed orthogonal magnetic fields, magnetic flux densities the fixed magnetic fields are different from each other.

When the electromagnetic wave to be detected irradiates all the detector cells evenly, or when the detector cells are arranged in such close proximity with each other that the electromagnetic wave may be assumed to irradiate all the detector cells evenly, angular cyclotron resonance frequency $\omega_c$ in each cell shows an individual value. The cyclotron resonance is enhanced only in a specific detector cell which shows the same or similar angular cyclotron resonance frequency $\omega_c$ with the angular vibration frequency $\omega_f$ of the irradiated electromagnetic wave. The cyclotron resonance is not enhanced in the other cells. Thus, the wavelength of the irradiated electromagnetic wave is detected by identifying the angular cyclotron resonance frequency $\omega_c$ of the specific detector cell, the anode current of which is large because of the cyclotron resonance, on the real time basis without sweeping the excitation current. In addition to this, the second embodiment facilitates intensity measurement of the electromagnetic wave from the peak height of the anode current and spectrometric measurement of wavelength distribution of the electromagnetic wave like simultaneous measurement of wavelengths of a plurality of electromagnetic waves.

The anode current value depends on the spatial alignment of the detector cell with respect to the electric field plane of the irradiated electromagnetic wave. Accuracy of the wavelength measurement can be improved by arranging the detecting apparatuses of the first embodiment or the detector cells of the second embodiment along three axes of the orthogonal coordinates so as to enhance cyclotron resonance for each orthogonal component of the electric field of the electromagnetic wave.

Figure 2A:
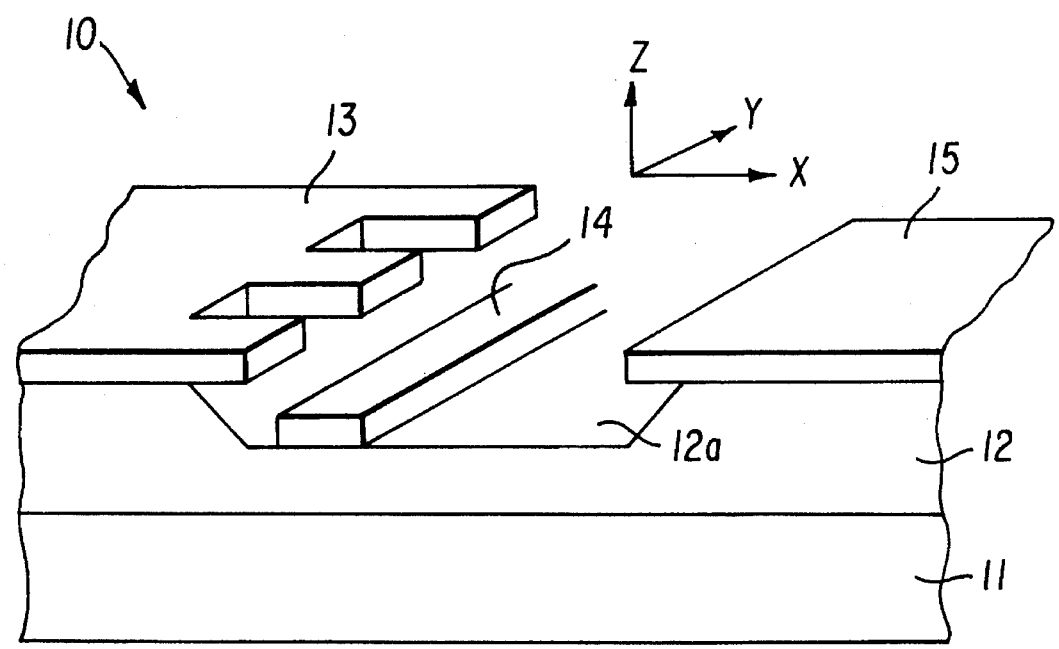
Figure 2A:
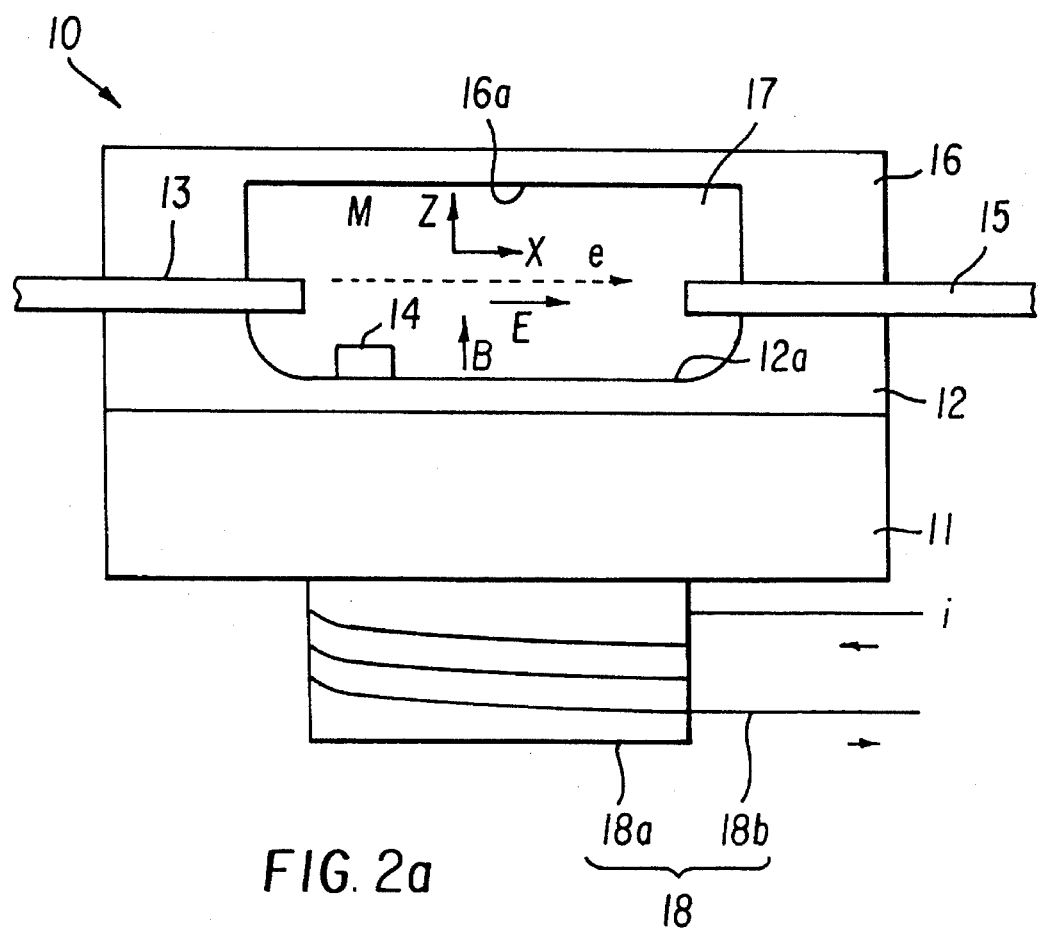

FIG. 2 shows a configuration of the first embodiment of an electromagnetic wave detecting apparatus according to the present invention, in which FIG. 2(a) shows a perspective view and FIG. 2(b) a sectional view. An electromagnetic wave detecting apparatus 10 comprises a oxidized silicon layer (hereinafter referred to as insulation layer) 12 formed on a silicon substrate 11; an inverted trapezoidal recess portion 12a formed on the insulation layer 12; a tungsten cold cathode (emitter electrode) 13 formed on the insulation layer 12 further comprising many comb-tooth like tips extending from one side above the recess portion 12a; a rectangular molybdenum gate electrode (control electrode) 14 disposed on the recess portion 12a on the side of the cold cathode 13; a tungsten anode (collector electrode) 15 formed on the insulation layer 12 and extending from another side opposed facing to the one side above the recess portion 12a; an insulative sealing member (quartz for example) 16 further comprising a recess portion 16a on its under surface for enclosing a dilute hydrogen gas in a vacuum space 17; and an electromagnet 18 further comprising a magnetic core 18a fixed on a back surface of the silicon substrate 11, and a solenoid coil 18b of an enameled wire wound around the magnetic core 18a.

Typical configurational parameters of the first embodiment are as follows. Size (chip size) of the silicon substrate 11 is 2 mm×2 mm. Thickness of the cathode 13 is 0.2 μm. Edge width of the comb-tooth like tip is 3 μm and pitch between the tips is 6 μm. The cathode 13 comprises about 270 pieces of tips and total width of the cathode 13 is about 1.6 mm. The gate electrode 14 is 0.2 μm in thickness, about 1.6 mm in width and 3 μm in length. The anode 15 is 0.2 μm in thickness and about 1.6 mm in width. Distance between the cathode 13 and the gate electrode 14 is 0.7 μm. Distance between the cathode 13 and the anode 15 is 10 μm. The cylindrical magnetic core 18a of 1 mm in diameter is made of Mn—Zn ferrite (its specific permeability is 5000). The electromagnet 18 is provided to apply a magnetic field along the direction (Z-direction) perpendicular to a plane which includes the cathode 13 and the anode 15 (XY-plane) in the vacuum space 17. The vacuum space 17 is filled with $3 \times 10^{-19}$ mole of the dilute hydrogen gas.

Zero or negative electric potential is applied to the cathode 13. Positive electric potential is applied to the gate electrode 14. Electric potential higher than the gate electric potential is applied to the anode 15. Since the electric field of the gate electrode 14 modulates the work function of tungsten to reduce integrated potential on the boundary surface of the cathode 13, electrons are drawn out from the cathode 13 (1) by the Schottky effect (tunnel effect).

It is well known by experiments that the current density of the electrons field-emitted along X-axis from the cathode 13 (1) shows little temperature dependence. And the current density of the field-emitted electrons shows almost steady value under high temperatures or under radiation exposure.

Since all the end surface of the comb-tooth like tips of the cathode 13 are positioned equally with respect to the gate electrode 14, equal current density is obtained on every end surface of the tips. Therefore, since threshold voltage of the field emission on every end surface of the tips is equalized, initial speed of the emitted electrons at the end surface is equalized.

The field-emitted electron moves towards the anode 15 attracted by an electric field E of the anode 15. Since a uniform magnetic field B orthogonal to the electric field E is applied in the vacuum space 17 by the electromagnet 18, the moving electron executes circular motion at an angular cyclotron frequency $\omega_c$ on the XY plane. The cyclotron angular frequency $\omega_c$ does not depend on the velocity of the electron and is proportional to the magnetic flux density B. Therefore the angular frequency $\omega_c$ increases and circular trajectory (traveling length) of the electron elongates with increasing magnetic flux density B. Thus the electron executes circular motion while moving towards the anode 15. In this situation, when an electromagnetic wave (electromagnetic wave to be detected), the angular vibration frequency $\omega_f$ of which coincides with the cyclotron angular frequency $\omega_c$ and an electric field direction of which coincides with the X-axis, irradiates the electron path, the electron is accelerated at its maximum to move faster and to gradually increase its radius of circular motion. Thus, the electron travels towards the anode 15 along a spiral trajectory. Since the angular cyclotron resonance frequency $\omega_c$ can be changed in proportion to the magnetic flux density B, cyclotron resonance can be enhanced by changing the magnetic flux density B. In the first embodiment, that can vary an excitation current i of the electromagnet 18, cyclotron resonance is enhanced by changing the magnetic flux density B by means of change of the excitation current i of the electromagnet 18. Since the electron is accelerated once the cyclotron resonance is enhanced, molecule M of the dilute hydrogen gas is dissociated to be ionized by collision with the accelerated electron and releases one electron. Since the ionized electron is then accelerated to trigger further ionization of the hydrogen gas molecules, electrons and ions are exponentially multiplied in the vacuum space 17. The multiplied electrons are captured by the anode 15 and the ions (hydrogen nucleuses) are captured by the cathode 13. Though only field-emitted electrons are captured by the anode to generate small anode current when the cyclotron resonance is not enhanced, an anode current peak is observed as a result of large anode current based on the multiplied carriers as a result of the cyclotron resonance.

Figure 3:
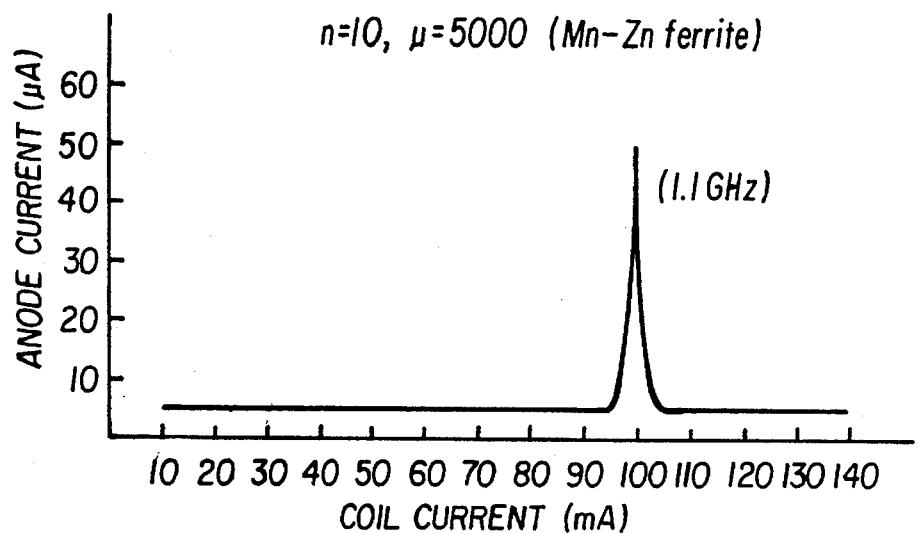
FIG. 3 is a wave chart showing relationship between anode current and a coil current in the first embodiment.

FIG. 3 is a chart showing change of an anode current $I_A$, at the gate voltage of 200 V and the anode voltage of 300 V, and under irradiation of a microwave of 1.1 GHz, with a coil current (excitation current) i swept from 10 mA to 140 mA. The number of turns n of the coil 18b in FIG. 3 is 10. In FIG. 3, the anode current IA shows a sharp peak at the coil current i of 100 mA and the peak height is 50. Since the angular cyclotron frequency $\omega_c$ is proportional to the magnetic flux density and therefore to the coil current i, a wavelength can be measured, for example in the wavelength range between 0.1 GHz and 1.4 GHz, by sweeping the coil current (excitation current) i from 10 mA to 140 mA.

Since the coil current value i can be varied over more than several orders of magnitude, a wavelength detector with wide dynamic range that measures wavelengths over more than several orders of magnitude of wavelength range is realized. Therefore, wavelengths from the microwave to infrared regions can be measured by a single wavelength detector. Since the electromagnetic wave detecting apparatus of the first embodiment obtains the electrons by the field emission from the cold cathode, the electromagnetic wave detecting apparatus works in any unfavorable environment, at high temperatures or under radiation exposure for example, without being affected by background noises. Since the electromagnetic wave detecting apparatus is suitable for manufacturing the cathode 13, the gate electrode 14, the anode, etc., including a thin film coil of the electromagnet 18 if necessary, by the semiconductor processing and thin film deposition techniques, the electromagnetic wave detecting apparatus facilitates extreme down-sizing and cost reduction. In addition to this, the electromagnetic wave detecting apparatus of the first embodiment is suitable for determining electromagnetic wave intensity by the measurement of peak height of the anode current because the peak height corresponds to the intensity of the irradiated electromagnetic wave.

In the first embodiment, a hydrogen gas is sealed in the vacuum space to an extent dilute enough not to deteriorate degree of vacuum and not to hinder electron emission while to prevent the vacuum space from discharge. Even though the sealed gas is very dilute, ionization triggered by dissociation proceeds without any trouble because the collision cross section of the electron with the sealed gas is enlarged by the spiral movement of the electron.

Figure 4:
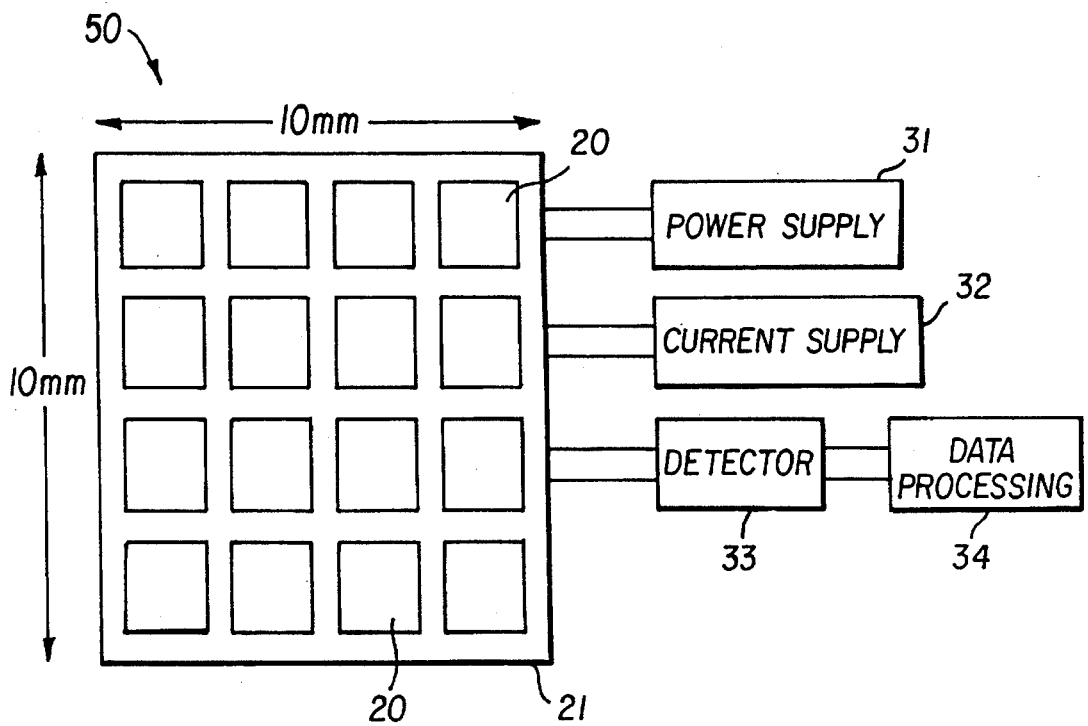
FIG. 4 is a block diagram schematically showing a configuration of the second embodiment of the electromagnetic wave detecting apparatus according to the present invention.
Figure 5:
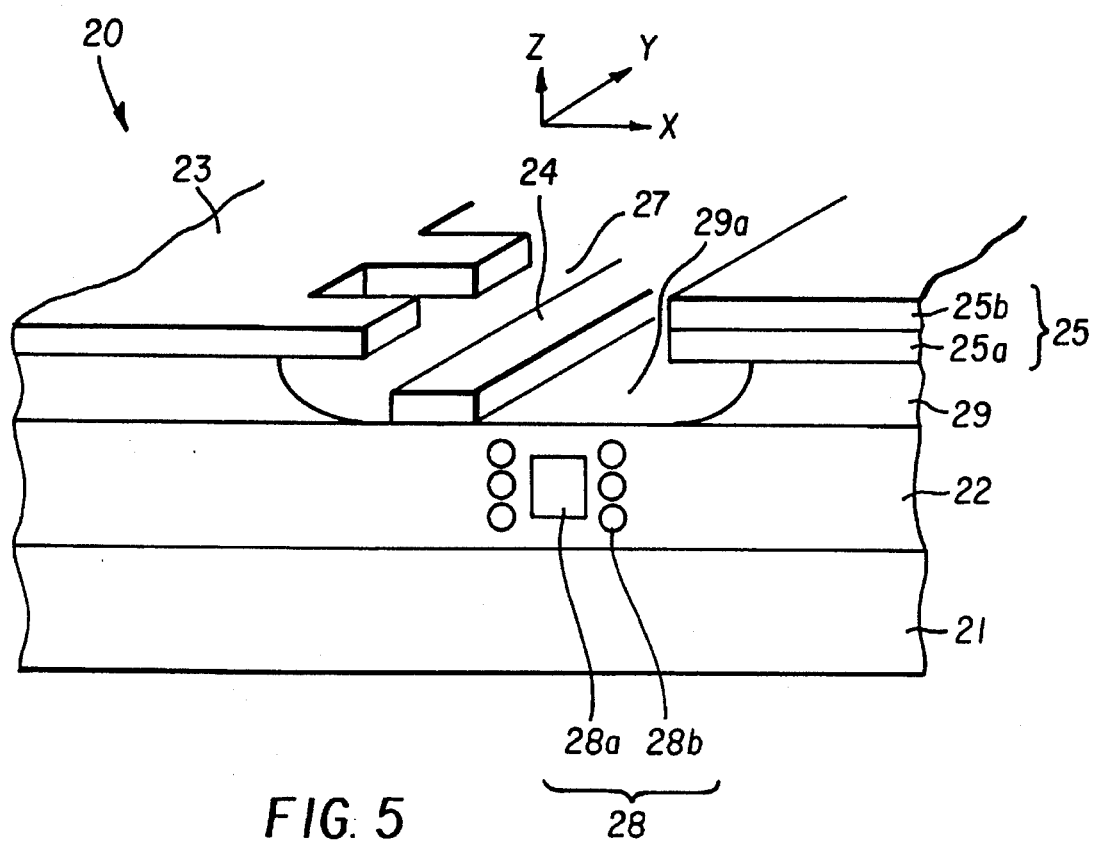
FIG. 5 is a sectional view schematically showing a configuration of a detector cell of the second embodiment.

FIG. 4 is a block diagram schematically showing a second embodiment of the electromagnetic wave detecting apparatus according to the present invention and FIG. 5 is a sectional view schematically showing a configuration of the second embodiment.

In FIG. 4, the wavelength detecting apparatus 50 of the second embodiment comprises sixteen electromagnetic field detector cells 20 of 2 mm×2 mm, arrayed on a silicon substrate 21 of 10 mm×10 mm in a 4×4 matrix. As shown in FIG. 5, each detector cell further comprises a silicon oxide layer (insulation layer) 22 formed on the silicon substrate 21; a thin film electromagnet 28 further comprising a magnet core 28a made of CoFe thin amorphous tape and buried in the silicon oxide layer 22, and a thin film coil 28b wound around the magnet core 28a; an upper insulation layer 29 formed on the silicon oxide layer 22; an inverted trapezoidal recess portion 29a formed in the upper insulation layer 29; a tungsten cold cathode (emitter electrode) 23 disposed over the upper insulation layer 29 further comprising many comb-tooth like tips extending from one side of and above the recess portion 29a; a rectangular niobium gate electrode (for drawing out electrons) 24 disposed on the recess portion 29a on the side of the cold cathode 23; an anode (collector electrode) 25, disposed over the upper insulation layer 29 opposed facing to the cathode 23 and extending above the recess portion 29a, further comprising a tungsten layer 25a and a niobium layer 25b; and a sealing member (not shown) for enclosing a hydrogen gas in a vacuum space 27 further comprising a recess portion in its under surface.

Typical configurational parameters of the second embodiment are as follows. Thickness of the cathode 23 is 0.2 μm. Edge width of the comb-tooth like tip is 3 μm and pitch between the tips is 6 μm. The cathode 23 comprises about 100 pieces of comb-tooth like tips. The gate electrode 24 is 0.2 μm in thickness. The anode 25 has a double layered structure that comprises a tungsten layer 25a of 0.2 μm in thickness and a niobium layer 25b of 0.2 μm in thickness. Distance between the cathode 23 and the gate electrode 24 is 0.7 μm. The thin film electromagnet 28 is provided to apply a magnetic field in the vacuum space 27 along Z-direction perpendicular to the XY plane that includes the cathode 23 and the anode 25. Number of turns and width of the coil 28b of the thin film electromagnet 28 in the sixteen detector cells 20 are set to be different from each other, and therefore flux density in Z-direction is different in each detector cell 20. The vacuum space 27 is filled with $3 \times 10^{-19}$ mole of the dilute hydrogen gas that corresponds to degree of vacuum of $3.75 \times 10^{-10}$ Pa.

As FIG. 4 shows, a power supply block 31 for supplying power to the cathode 23, the anode 25 and the gate electrode 24; a current supply block 32 for supplying a current to the coil 28b of the thin film electromagnet 28 in each detector cell 20; a current detector block 33 for detecting anode current in each detector cell 20; and a data processing block 34 for obtaining a wavelength of an electromagnetic wave on the basis of the detected electric current value in each cell are connected to the electromagnetic wave detector chip thus configured.

Since the electromagnetic wave detecting apparatus of the first embodiment detects cyclotron resonance frequency by sweeping the excitation current i, it is necessary to gradually vary intensity of the uniform orthogonal magnetic field, that then causes extended sweeping period of time. Therefore, the electromagnetic wave detecting apparatus of the first embodiment is not preferable when the wavelengths change from time to time, because the long sweeping period deteriorates wavelength detection response and reduces margin in sampling timing selection. The electromagnetic wave detecting apparatus of the second embodiment adopts a configuration that facilitates detecting wavelengths on the real time basis. The second embodiment arrays a plurality of the detector cells 20, which generate orthogonal magnetic fields the flux densities of which are set at individual values different from each other. So, the angular cyclotron resonance frequencies $\omega_{cs}$ of the detector cells 20 show values separated from each other, and therefore the cyclotron resonance is enhanced in a specific detector cell 20 that shows the angular cyclotron resonance frequency same with or near to the angular vibration frequency $\omega_f$ of the irradiated electromagnetic wave but not in all the other detector cells. Therefore, the wavelength of the electromagnetic wave is detected from the angular cyclotron resonance frequency $\omega_c$ of the cell by identifying the cell in that the cyclotron resonance is enhanced and the anode current is large. Thus, real time wavelength detection is realized by the second embodiment that does not need to sweep the excitation current. And the second embodiment measures intensity of the electromagnetic wave from the peak height of the anode current. In addition, the second embodiment facilitates spectrometric measurement of wavelength distribution of the electromagnetic wave like simultaneous measurement of wavelengths of a plurality of electromagnetic waves.

Now the manufacturing of the detector cell of the electromagnetic wave detecting apparatus according to the present invention will be explained focussing on manufacturing processes of the detector cell. FIGS. 6(A) to 6(H) are sectional views of the electromagnetic wave detecting apparatus for explaining the manufacturing processes of the detector cell.

Figure 6A:
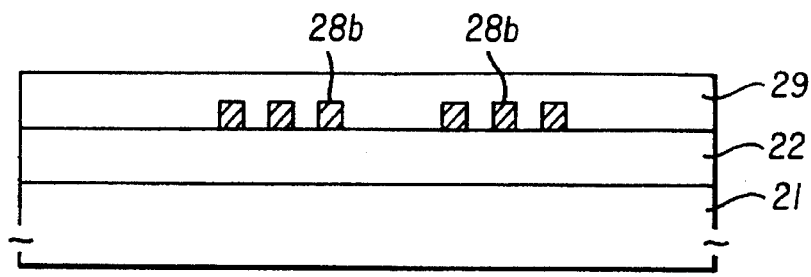
FIGS. 6(a)–6(h) show sectional views for explaining manufacturing processes of the electromagnetic wave detecting apparatus of the first embodiment or the detector cell of the second embodiment.

As shown in FIG. 6(A), the spiral thin film coil 28b is formed by vapor deposition of Cu and by the photolithographic technique on the silicon oxide layer 22 of 1 μm in thickness formed by oxidizing the silicon substrate 21. The upper insulation layer 29 of SiO2 is deposited by the chemical vapor deposition technique (CVD) on the layer 22 so as to cover the coil 28b and the surface of the layer 29 is flattened. In the formation of the thin film coil 28b, number of turns and coil width as well as turning pitch are set cell by cell at different values.

Figure 6B:
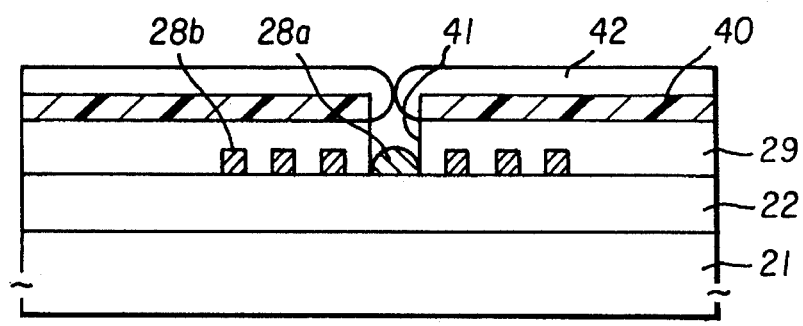

Then, as shown in FIG. 6(B), a photoresist layer 40 is formed on the upper insulation layer 29 and a window is formed through the layer 40 in a portion corresponding to the central portion of the thin film coil 28b. A groove 41 is then formed through the upper insulation layer 29 on the central portion of the thin film coil 28b utilizing the photoresist layer 40 as a mask and CoFe alloy is sputter-deposited. Through this process, a magnet core 28a of CoFe alloy is buried in the groove 41 and a CoFe alloy layer 42 is laminated on the photoresist layer 40.

Figure 6C:
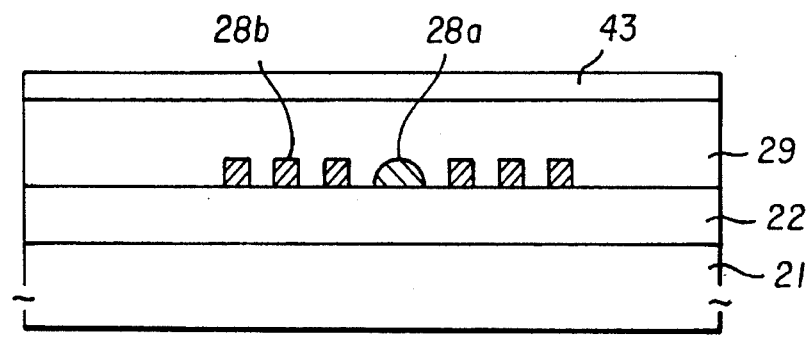

After leaving the magnet core 28b behind in the groove 40 by removing the photoresist layer 40 and the CoFe alloy layer 42 by the lifting-off technique that washes out the layers 40 and 42 with acetone, an $SiO_2$ layer is deposited again on the upper insulation layer 29 by the CVD and a surface of the re-deposited $SiO_2$ layer is flattened as shown in FIG. 6(C). Through this process, the groove 40 is filled with $SiO_2$. Then a tungsten layer 43 is sputter-deposited on the upper insulation layer 29.

Figure 6D:
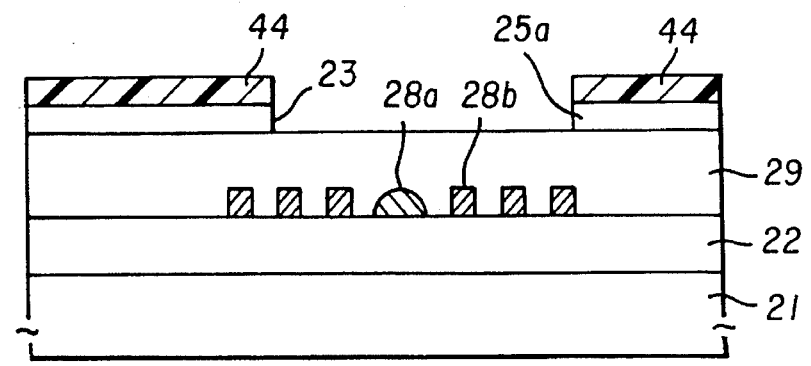

Then, as shown in FIG. 6(D), a photoresist layer 44 is laminated and a tungsten layer 43 is patterned by the photolithographic technique to form the cathode 23 and the tungsten layer 25a of the anode 25.

Figure 6E:
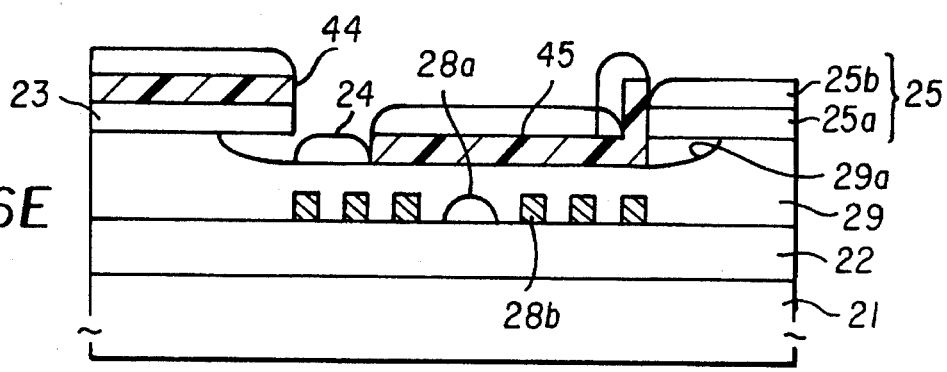

As shown in FIG. 6(E), the photoresist layer 44 on the tungsten layer 25a is removed after the recess portion 29a is formed on the upper insulation layer 29 by employing the patterned cathode 23 and the tungsten layer 25a of the anode 25 as masks. Then the gate electrode 24 is formed on the recess portion 29a on the side of the cathode 23 and a niobium layer 25b is formed on the cathode 23 and a niobium layer 25b is formed on the tungsten layer 25a of the anode 25 by the electron beam deposition of niobium after forming a photoresist layer 45 that has a window formed on the side of the cathode 23 on the recess portion 29a.

Figure 6F:
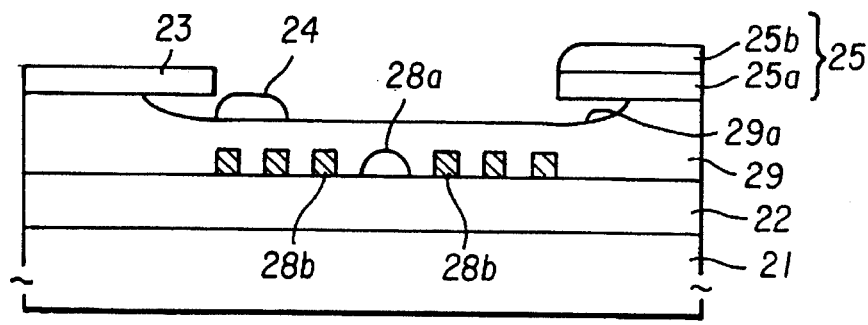

As shown in FIG. 6(F), the gate 24 and the niobium layer 25b of the anode 25 are left behind by removing the photoresist layer 44 and the niobium layer on the cathode 23 as well as the photoresist layer 45 and the niobium layer on the recess portion 29a by the lift-off technique that employs washing-out with acetone.

Figure 6G:
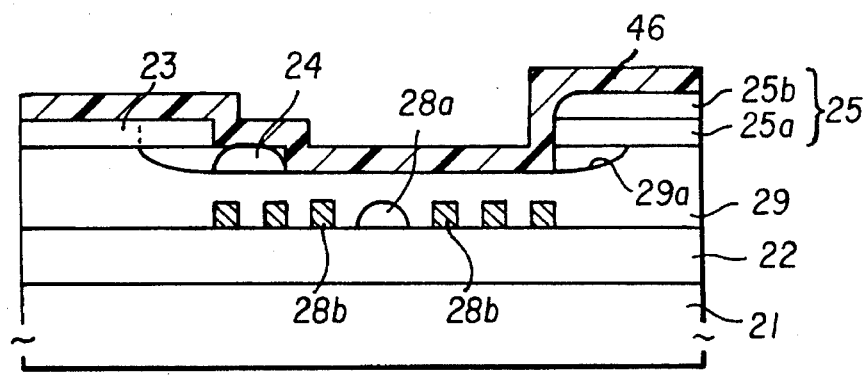
Figure 6H:
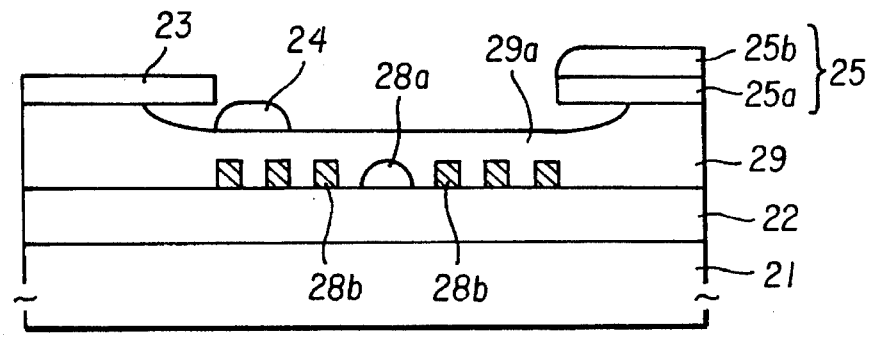

A photoresist layer 46 is formed and patterned, as shown in FIG. 6(G), and the comb-tooth like tips of the cathode 23 are patterned by employing the patterned layer 46 as a mask. And the photoresist layer 46 is removed as shown in FIG. 6(H). By the end of this process, the configuration shown in FIG. 5 is obtained. Manufacturing of the electromagnetic wave detecting apparatus is completed by depositing the insulation sealing member (not shown in FIG. 5) for sealing in a dilute hydrogen gas in the vacuum space 17 as a space in the recess portion 29a.

In the embodiment described above, magnetic flux density of each detector cell is preferably tuned at a predetermined value by changing the structural parameters like the number of turns of the coils cell by cell while fixing the excitation currents of the cells at a constant value. However, it is also preferably for obtaining a predetermined magnetic flux density value to change the excitation current value of the coils 28a cell by cell while selecting the same structural parameters for all the cells. According to the present invention, number of the cells is not limited to sixteen. An electromagnetic wave detecting apparatus that comprises more detector cells improves its wavelength resolution or expands its dynamic range of wavelength detection.

The orientation of the electromagnetic wave detecting apparatus with respect to the irradiated electromagnetic wave determines the anode current value. Therefore, orientation dependence of wavelength detection is eliminated and accuracy of wavelength detection is improved by orienting the electromagnetic wave detecting apparatuses or the detector cells of the present invention evenly in the three dimensions so as to enhance cyclotron resonance in response to an electric field component along each axis of the orthogonal coordinates.

As described above, according to the present invention, the traveling length of the electron as a charged particle emitted from the cold cathode is increased by cyclotron motion enhanced by the orthogonal magnetic field on the way of its attraction to the anode. The electron in circular motion is accelerated by repeatedly feeding kinetic energy by the cyclotron resonance enhanced when the angular cyclotron frequency $\omega_c$ of the electron responsive to the magnetic flux density orthogonal to the circular trajectory of the electron and the angular frequency $\omega_f$ of the irradiated electromagnetic wave to be measured coincide with each other. The accelerated electron collides with dilute gas molecules to dissociate and ionize the gas molecules. The ion-pairs thus generated are captured by the cathode and anode. Therefore following effects are obtained by the present invention.

(1) A much larger current peak is obtained from the anode when the cyclotron resonance is enhanced than an anode current based only on the electrons when the cyclotron resonance is not enhanced. Since the current peak is obtained by changing the magnetic flux density, the wavelength of the irradiated electromagnetic wave is detected from the angular cyclotron frequency $\omega_c$ that coincides with the angular frequency $\omega_f$ of the electromagnetic wave. And the intensity of the electromagnetic wave is determined by measuring the peak height of the anode current.

(2) Since the angular cyclotron frequency $\omega_c$ is proportional to the magnetic flux density B of the excitation current, wavelength can be measured over several orders of magnitude of wavelengths, from microwave to infrared regions, by changing the excitation current over the corresponding orders of magnitude.

(3) Since field-emission from a cold cathode is employed for obtaining electrons, wavelength can be measured from the microwave to infrared regions.

(4) Since the electromagnetic wave detecting apparatuses of the present invention are preferably manufactured by the semiconductor processing techniques, extreme down-sizing and cost reduction of the detecting apparatuses are realized.

(5) By employing the electromagnetic wave detecting apparatus that comprises a plurality of electromagnetic wavelength detector cells which further comprise fixed magnetic field application means for applying fixed orthogonal magnetic fields, the magnetic flux density of which are different with each other, the wavelength of the irradiated electromagnetic wave is detected from the angular cyclotron frequency $\omega_c$ of the cell that shows the maximum anode current. This detecting apparatus eliminates lengthy sweeping of excitation current and facilitates real-time wavelength measurement.

What is claimed is:

1. An electromagnetic wave detecting apparatus comprising:

an electron emitting means including a cold cathode for emitting electrons;

an electron capturing means including an anode for capturing electrons attracted thereto from said cathode through evacuated space;

a magnetic field application means including an electromagnet that can vary an excitation current thereof for applying in said evacuated space a magnetic field orthogonal to an electric field applied between said cathode and said anode; and a sealing means for sealing a dilute gas in said evacuated space.

2. An electromagnetic wave detecting apparatus comprising:

a plurality of electromagnetic wave detecting cells, wherein each cell includes:

an electron emitting means comprising a cold cathode for emitting electrons;

an electron capturing means comprising an anode for capturing electrons attracted thereto from said cathode through evacuated space;

a magnetic field application means for applying in said evacuated space a magnetic field orthogonal to an electric field applied between said cathode and said anode; and a sealing means for sealing a dilute gas in said evacuated space;

wherein the magnetic field application means of said electromagnetic wave detecting cells comprise fixed magnetic field application means for applying fixed orthogonal magnetic fields, and the magnetic flux densities thereof are different from each other.

3. An electromagnetic wave detecting apparatus comprising:

an insulation layer, formed on a semiconductor substrate, comprising a recess portion;

a cathode formed on one side of said recess portion on said insulation layer;

an anode formed on another side opposite to said one side of said recess portion on said insulation layer;

a control electrode formed on the side of said cathode on said recess portion;

a sealing means for sealing in dilute gas in an evacuated space enveloping therein said cathode, said anode, and said control electrode; and a magnetic field application means for applying a magnetic field orthogonal to an electric field applied between said cathode and said anode.

4. The electromagnetic wave detecting apparatus as claimed in claims 3, wherein said magnetic field application means comprises an electromagnet disposed on a back surface of said semiconductor substrate.

5. The electromagnetic wave detecting apparatus as claimed in claims 3, wherein said magnetic field application means comprises a thin film electromagnet buried in said insulation layer on said semiconductor substrate.

* * * * *